US008108353B2

(12) United States Patent
Balachandran et al.

(10) Patent No.: US 8,108,353 B2
(45) Date of Patent: Jan. 31, 2012

(54) METHOD AND APPARATUS FOR BLOCK SIZE OPTIMIZATION IN DE-DUPLICATION

(75) Inventors: Subashini Balachandran, Sunnyvale, CA (US); Mihail Corneliu Constantinescu, San Jose, CA (US); Jan Hendrik Pieper, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 519 days.

(21) Appl. No.: 12/137,462

(22) Filed: Jun. 11, 2008

(65) Prior Publication Data

US 2009/0313248 A1 Dec. 17, 2009

(51) Int. Cl.
*G06F 17/00* (2006.01)
(52) U.S. Cl. ........................................ 707/664; 707/692
(58) Field of Classification Search .................. 711/161, 711/162, 170; 713/324; 707/664, 672, 673, 707/692
See application file for complete search history.

(56) References Cited

U.S. PATENT DOCUMENTS

| | | | | |
|---|---|---|---|---|
| 4,215,402 | A | * | 7/1980 | Mitchell et al. ................ 711/216 |
| 5,627,748 | A | * | 5/1997 | Baker et al. .................... 715/210 |
| 7,200,604 | B2 | | 4/2007 | Forman et al. |
| 2002/0123995 | A1 | * | 9/2002 | Shibuya .............................. 707/6 |
| 2007/0177739 | A1 | | 8/2007 | Ganguly et al. |
| 2007/0255758 | A1 | | 11/2007 | Zheng et al. |
| 2008/0133561 | A1 | * | 6/2008 | Dubnicki et al. .............. 707/101 |
| 2009/0013129 | A1 | * | 1/2009 | Bondurant ..................... 711/115 |
| 2009/0204636 | A1 | * | 8/2009 | Li et al. ...................... 707/103 Y |

OTHER PUBLICATIONS

HYDRAstor: New Architecture for Disk-based Backup, GlassHouse Whitepaper, 2007, pp. 1-15.; http://www.nec.co.jp/products/istorage/whitepaper/file/hydra_backup.pdf.

* cited by examiner

*Primary Examiner* — Tony Mahmoudi
*Assistant Examiner* — Md. I Uddin
(74) *Attorney, Agent, or Firm* — Kenneth L. Sherman, Esq.; Michael Zarrabian, Esq.; Myers Andras Sherman & Zarrabian LLP

(57) ABSTRACT

The invention provides a method and apparatus for determining sizing of chunk portions in data de-duplication. The method chunks input data into segments where each segment has a first size, assigns an identifier to each of the data segments, assigns an index to each of the identifiers, creates a suffix structure and a longest common prefix structure from the indexes, detects repeated sequences of indexes and non-repeated indexes from the suffix structure and the longest common prefix structure, determines a second size based on said detected repeated sequences and non-repeated indexes, and chunks the input data into a second plurality of data segments each having the second size.

17 Claims, 7 Drawing Sheets

METHOD AND APPARATUS FOR BLOCK SIZE OPTIMIZATION IN DE-DUPLICATION

BACKGROUND OF THE INVENTION

1. Field of the Invention

The present invention relates generally to de-duplication, and in particular to optimizing data chunking segment size.

2. Background Information

De-duplication methods partition an input object (or stream) into smaller parts such as blocks/segments, known as "chunks", and retain only the unique chunks in a repository. Conventionally, there are different ways to chunk an object, such as fixed size chunks, content dependent using fingerprints, etc. A limitation of such chunking methods is that regardless of the chunking method employed, de-duplication performance (compression ratio) is better when the chunk sizes are smaller.

Smaller chunks, however, require more accesses to the repository (e.g., disk drive) when reconstructing an object (a problem known as "fragmentation"), and relatively more entries in the repository (repository of chunks). Conventional de-duplication systems normally use a "one size fits all" approach, failing to adapt the chunk sizes to variation in compressibility of a given workload.

SUMMARY OF THE INVENTION

The invention provides a method and apparatus for determining sizing of chunk portions in data de-duplication. One embodiment involves chunking input data into segments where each segment has a first size, assigning an identifier to each of the first plurality of data segments, assigning an index to each of the identifiers, creating a suffix structure and a longest common prefix structure from the indexes, detecting repeated sequences of indexes and non-repeated indexes from the suffix structure and the longest common prefix structure, determining a second size based on said detected repeated sequences and non-repeated indexes, and chunking the input data into a second plurality of data segments each having the second size.

In another embodiment of the invention, an apparatus for determining segment size in de-duplication is provided. The apparatus includes a chunking module configured to segment input data into a first plurality of data segments each having a first size, an indexing module configured to assign an index to each of the first plurality of data segments, an identifier module configured to apply the content hash of each of the first plurality of data segments as an identifier to each of the first plurality of data segments, where the indexing module is further configured to assign an index to each of said identifiers, and create a suffix structure and a longest common prefix structure from the indexes, and an array processor module configured to detect repeated sequences of indexes and non-repeated indexes from the suffix structure and longest common prefix structure, and to determine a second size based on the detected repeated sequences of indexes and non-repeated indexes. The chunking module further segments the input data into a second plurality of data segments each having the second size.

Yet another embodiment of the invention provides a computer program product for determining segment size in de-duplication. The computer program product when executed by a processor chunks input data into a first plurality of data segments each having a first size, assigns an identifier to each of the first plurality of data segments, assigns an index to each of said identifiers, creates a first structure and a second structure from the indexes, detects repeated sequences of indexes and non-repeated indexes from the first structure and the second structure, determines a second size based on the detected repeated sequences of indexes and non-repeated indexes, and chunks the input data into a second plurality of data segments each having the second size.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the invention, as well as a preferred mode of use, reference should be made to the following detailed description read in conjunction with the accompanying drawings, in which.

DESCRIPTION OF THE PREFERRED EMBODIMENTS

The following description is made for the purpose of illustrating the general principles of the invention and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

The description may disclose several preferred embodiments of optimizing data chunking segment size for data de-duplication, as well as operation and/or component parts thereof. While the following description will be described in terms of de-duplication reduction processes and devices for clarity and to place the invention in context, it should be kept in mind that the teachings herein may have broad application to all types of systems, devices and applications.

The invention provides a method and apparatus for determining sizing of chunk portions in data de-duplication. One embodiment involves chunking input data into segments where each segment has a first size, assigning an index to each of the identifiers, creating a suffix structure and a longest common prefix structure from the indexes, detecting repeated sequences of indexes and non-repeated indexes from the suffix structure and the longest common prefix structure, determining a second size based on said detected repeated sequences and non-repeated indexes, and chunking the input data into a second plurality of data segments each having the second size.

Embodiments of the invention provide methods to use "large chunks" while obtaining similar de-duplication (compression) ratios as achieved when using smaller chunks. The invention provides a significant reduction of "fragmentation" (number of disk accesses necessary to reconstruct an original data object) associated with using small chunks, and implicitly a reduction of repository metadata (i.e., the number of entries). In one embodiment of the invention, in a client-server architecture where data object chunking is performed at the client, less hashes (chunk IDs) need to be communicated to the server having the repository for storing data object chunks, which achieves a significant reduction in bandwidth consumption. Also, there is less chattiness on the network due to the transfer of larger data chunks.

Figure 1A:
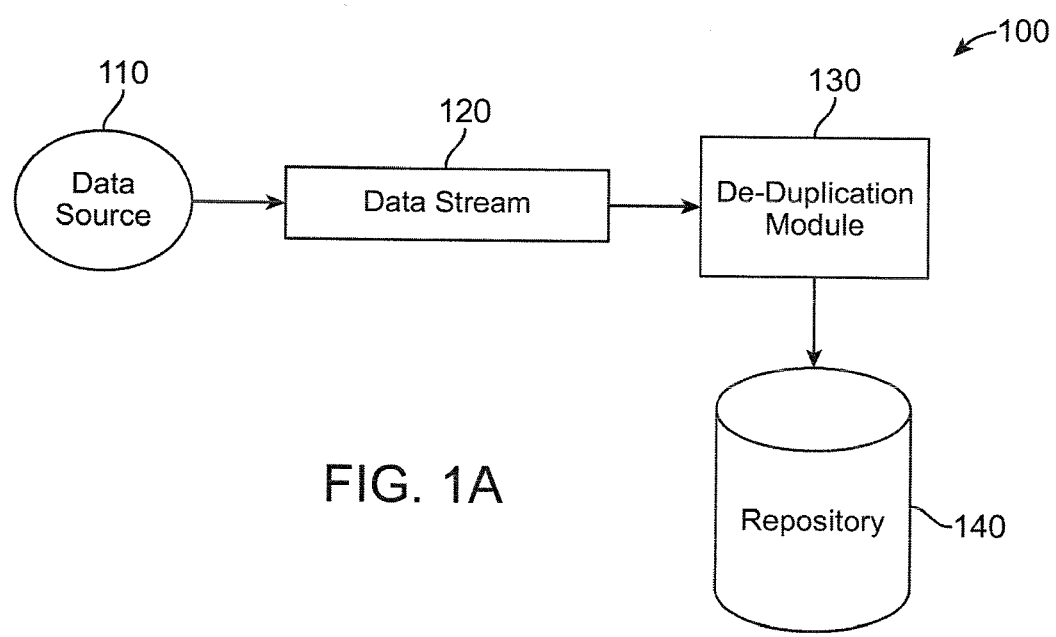
FIG. 1A illustrates an apparatus for determining segment size in de-duplication according to one embodiment of the invention.

FIG. 1A illustrates a block diagram of a system 100 including a de-duplication module 130 for determining optimum sizing of chunk portions in data de-duplication according to one embodiment. As illustrated, system 100 includes a data source 110 comprising uploaded/downloaded files (e.g., data files, video/audio files, streaming media, etc.) that can be resident or non-resident in system 100. In one example, the data source 110 is downloaded from a network (wired or wirelessly) such as the Internet, a local area network (LAN), wide area network (WAN), a disk, a disk drive, flash card, memory, etc. A data stream 120 is routed or transmitted from the data source 110 to the de-duplication module 130 for chunking the data in the data stream into optimized sized segmented portions or chunks. The chunked portions of data are forwarded from the de-duplication module 130 to the repository 140.

Figure 1B:
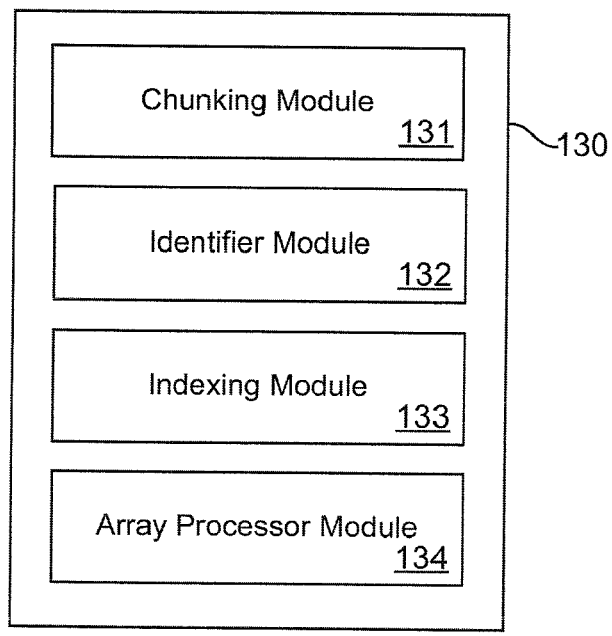
FIG. 1B illustrates a de-duplication module of the apparatus illustrated in FIG. 1A.

FIG. 1B illustrates an implementation of the de-duplication module 130 in further detail, including a chunking module 131, an identifier module 132, an indexing module 133 and an array processor module 134. In one example, the chunking module 131 is configured to segment input data into a data segments each having a first fixed size using chunking processes, such as Rabin fingerprinting, fixed chunks or sliding window, etc. The chunking module 131 operates directly on data units such as individual byte values (e.g., chunk size=1 byte) in which case the assigned index by indexing module 133 is equal to the byte value itself.

In one embodiment, the indexing module 133 is configured to hash content of each of the data segments. The identifier module 132 is configured to apply the content hash of each of the data segments as an identifier to each of the data segments. Identical chunks only need to be stored once and are represented by using the chunk identifier repeatedly in the encoding. The LRCs (Largest sequence of Repeated Chunks) and the chunks that do not repeat (i.e., only occur once, herein denoted as "non-repeats" (NR), are detected by the array processor module 134. The LRC are Repeated Chunk identifiers (RC) that cannot be extended (at the left or right end of a sequence of identifiers), while still being repeated.

The indexing module 133 is further configured to assign an index to each of the identifiers, and create a suffix structure, such as a suffix array (SA), suffix tree, etc., and a longest common prefix structure, such as a longest common prefix (LCP) array, an LCP tree, etc., from the indexes. The SA can be created in linear time and use linear space in the size of the input object. In one embodiment of the invention with SAs, a suffix tree structure is inferred, and the LCP array is used for the inference.

The array processor module 134 is configured to determine a second size based on the detected repeated sequences of indexes and non-repeated indexes. The chunking module 131 further segments the input data into a second set of data segments each having the second optimized size. The array processor module 134 may further analyze the SA and assign the indexes into groups and the second size is further based on the size of the groups. The chunking module 131 uses the second size to segment data chunks accordingly, where the second size is larger than the first size, and is considered a "Superchunk." It should be noted that each chunk portion i has a first size $s_i$ (where the sizes between chunk portions may vary), and second sizes s' are chunked into a second plurality of chunk portions j with sizes $s'_j$ (where the sizes between chunk portions may vary).

An RC corresponds to a non-terminal node in an inferred suffix tree; the RC will repeat as many times since many leaves share this non-terminal node. Terminal nodes (leaves) in the suffix tree contain the starting position in the original sequence where the RC will show up. We name left-ID the chunk ID that precedes the suffix represented by a leaf and in one embodiment we store it in the leaf. Two leaves are herein denoted "left-diverse" if their left-IDs are different, and a leaf is herein denoted as left-diverse, when it is left diverse relative to any deeper leaf on the same branch.

An RC is part of some LRC. The process for detecting what LRC a given RC belongs to is herein denoted as RC resolution, and is performed by array processor module 134. In one example, a fast way to discover what parts of the object are still uncovered after the LRCs and NRs are detected is that these parts correspond to the deepest left-diverse leaves on a branch. If adjacent chunks are NRs, in one example these chunks are grouped to form NR chunks of greater size. The distinct LRCs and NRs constitute new, larger chunks used in the optimized encoding according to an embodiment of the invention. Each distinct LRC occurs at least twice in the original encoding.

In one implementation, a hashing function is used to create the hash of the content of the chunk portions of the data objects by the identifier module 132. Known hash functions may be used, such as a division-remainder method, folding, radix transformation, digit rearrangement, etc. In another implementation, cryptographic hash functions are used, such as MD2, MD4, MD5, the Secure Hash Algorithm (SHA), etc. After de-duplication, each occurrence of an LRC, RC or NR is replaced by a hash (e.g., SHA1 with a size of 20 bytes), an offset (2 bytes) and a length (2 bytes) (i.e., a <hash, offset, length> format). The SHA1 corresponds to the repository 140 block used (the actual data), the offset is the position inside the block where the replaced sequence starts, and the length is the size of the sequence, each in bytes. In other implementations, other encodings are used, such as where the offset and length fields are avoided if the entire chunk is used or to tag the certain type of sequences and other special cases that are possible. Also, the offsets and the lengths can be entropy coded using known methods like Huffman coding.

In another example, in order to maintain the compression ratio close to ideal (i.e., a ratio as obtained when using small chunks, without including metadata), the distinct Superchunks stored in the repository 140 need to be free of repetitive structures. Repetitions are found inside these large chunks by detecting overlapping occurrences of the same Superchunk by the array processing module 134. A non-overlapping portion between the beginning of the two overlapping occurrences is a "run," i.e., a subsequence for example {a,b,c} that has repeated {a,b,c, a,b,c, a,b, ... } and covers the entire Superchunk.

In one example, the individual modules included in the de-duplication module 130 can comprise a software process, a hardware module or a combination of software and hardware. In one embodiment, system 100 is implemented in a server, a client, a server and client, a personal computer, a personal computing device, a portable computing device, a networked system, a distributed system, etc.

Figures 2, 3:
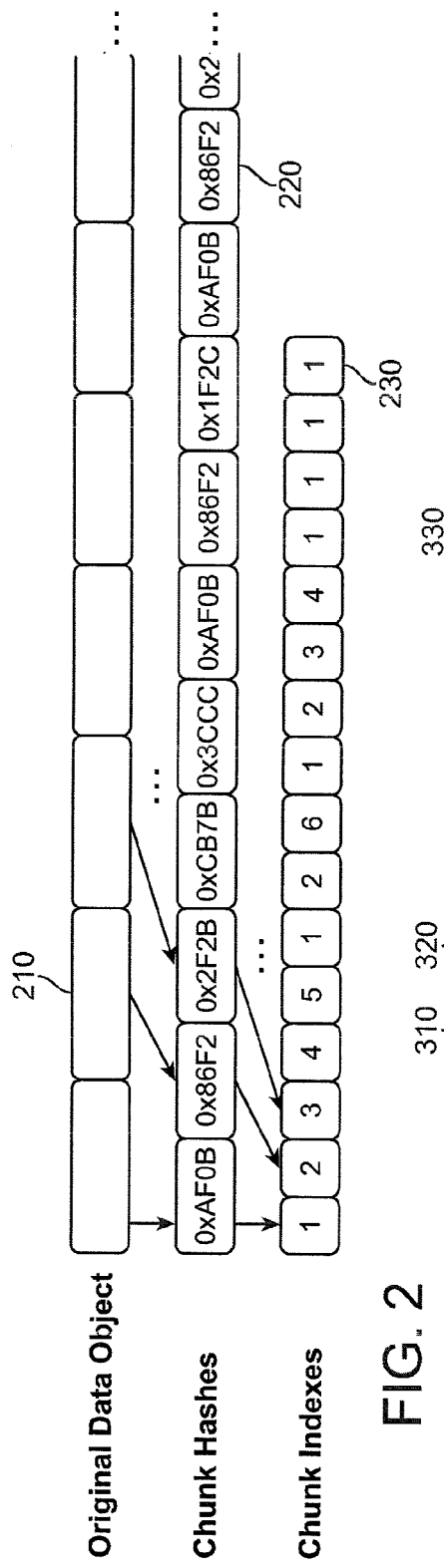
FIG. 2 illustrates an example of indexing of hashed content of data objects according to an embodiment of the invention.
FIG. 3 illustrates an example of a suffix structure and a longest common prefix structure according to an embodiment of the invention.

FIG. 2 illustrates a visualization for an exemplar data stream that is processed by the embodiments of the invention. The original data object 210 is illustrated original chunked segments. The content of the chunked original object data 210 are hashed as illustrated as chunk hashes 220. Distinct indexes 230 (e.g., integers) are assigned to the chunk hash 220 values. As illustrated the original data object 210 is represented as a sequence of distinct integers. When the individual byte values are operated on directly, assigning of indexes is unnecessary. Therefore, the content of each chunk is hashed and then assigned an index for each unique chunk. Chunks with equal content (hash) are assigned the same chunk index.

Figure 4:
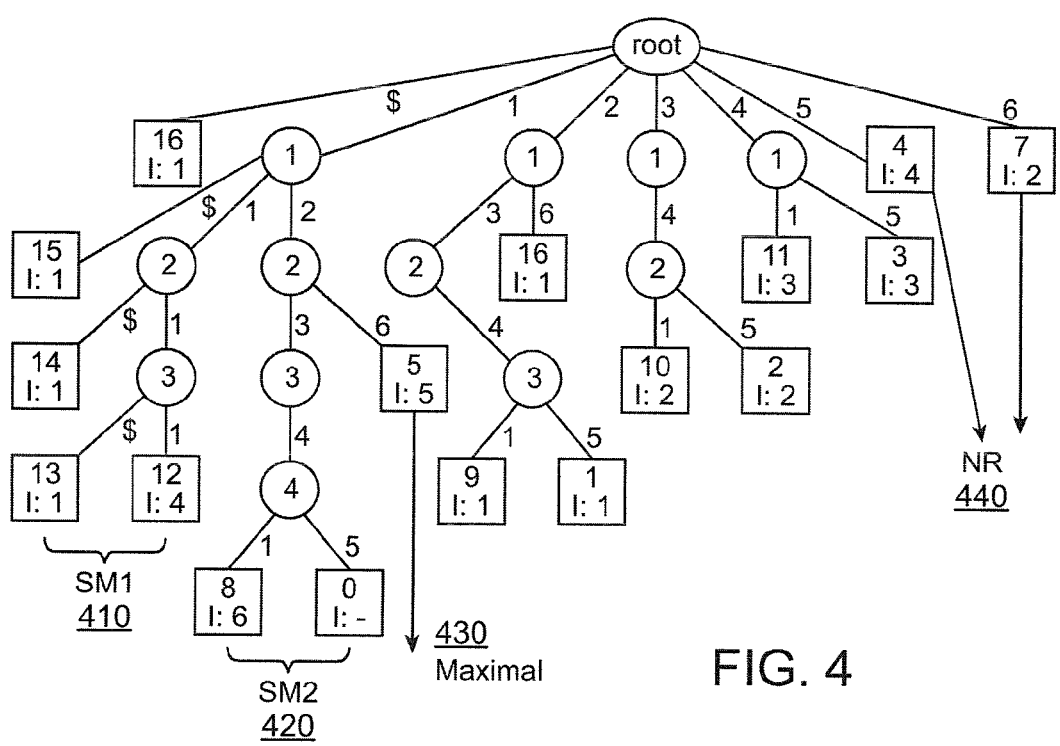
FIG. 4 illustrates an example of a suffix tree representation based on the suffix structure and longest common prefix structures illustrated in FIG. 3.

FIG. 3 illustrates exemplar chunk indexes 230 represented as an SA 310 and LCP. In this example, the chunk index sequence (original data object 210) is represented as: 1-2-3-4-5-1-2-6-1-2-3-4-1-1-1-1-$ ($ denotes an end of a sequence) and is processed to create the SA 310 and LCP 310, which are used to infer a suffix tree. FIG. 4 illustrates an exemplar suffix tree for the exemplar sequence shown in FIG. 3. As illustrated the suffix tree is represented by this SA and LCP. Terminal nodes (leaves) in the suffix tree contain the starting position in the original sequence. The leaves are stored in the preceding (to the left) chunk ID in the original sequence, herein denoted as left-ID. As illustrated, leaves are represented as squares. Inner nodes indicate the depth of the tree and the edge values represent the chunk index sequence. For example, the chunk sequence represented by the leaf "10" (which corresponds to the sub-sequence in the original input starting at position 10) is "3-4" and is preceded by "2." Inner nodes that only have one child can be collapsed into a compressed suffix tree representation, however, all inner nodes are shown for simplification.

In one example, the inferred suffix tree is used to detect and locate the longest repeated sub-sequence within a given sequence of IDs, herein denoted as "supermaximals," which correspond to the LRC. The inferred suffix tree illustrated in FIG. 4 contains two supermaximals (410, 420): sm1 410="1-1-1" and sm2 420="1-2-3-4." The sequence "1-1-1" represents a "run," which can be further optimized and encoded as a repeat of the chunk "1" according to an embodiment of the invention.

NRs 440 are leaves illustrated in FIG. 4 that are directly attached to the root of the inferred suffix tree. The deepest left-diverse leaves on a branch are herein denoted as "maximals" (e.g., maximal 430). The maximals indicate uncovered sections of the original input sequence. This follows as maximals share a part of the path with some supermaximal and begin with a unique left-value, which indicates that this sequence is in a different location in the original input. It is therefore not covered by the supermaximals.

In another example, only supermaximals and NRs are used for determining the larger chunking size. This is due to the fact that all repeating sub-sequences are part of the same supermaximal, because if the repeating sub-sequences are left-diverse they are a supermaximal, if they are not left-diverse, they can be extended to the left until some supermaximal will contain them. The remaining chunks then have to be NRs. Encoding may include supermaximals, maximals and NRs, where maximals are encoded as sub-sequences of the supermaximal they belong to.

Figure 5:
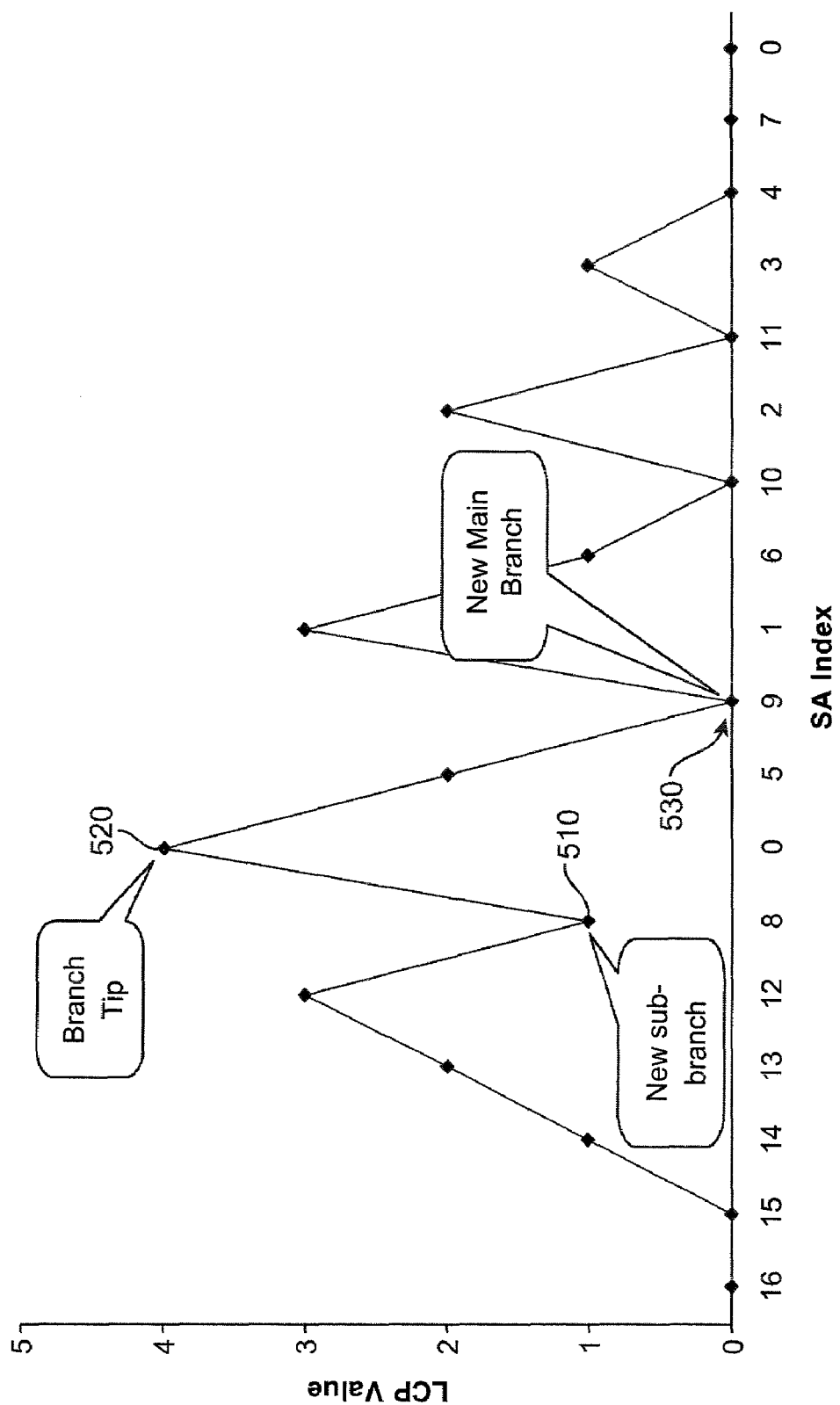
FIG. 5 illustrates an exemplar graph representing largest common prefix values versus suffix structure index values according to an embodiment of the invention.

FIG. 5 shows an exemplary graph illustrating how the inferred suffix tree is used, according to an embodiment of the invention. Instead of building the suffix tree, the embodiments operate on the SA and LCP. These two arrays provide all the information necessary to identify supermaximals, maximals and NRs. The LCP is visualized as shown in the graph. Branch tips (local maxima), main branches (LCP=0) and sub-branches (local minima) are then detected. The local graph maxima at 12, 0, 1, 2 and 3 correspond to the branch tips in the suffix tree shown in FIG. 4. Further (13, 12) and (8, 0) are branch tips on the same main branch (beginning at root), because of the local graph minima at 8. The suffix tree structure may be inferred from the SA and LCP arrays by detecting local changes in the LCP values, and finding local minima and maxima, which indicate branch tips, sub-branches and new branches.

Figure 6:
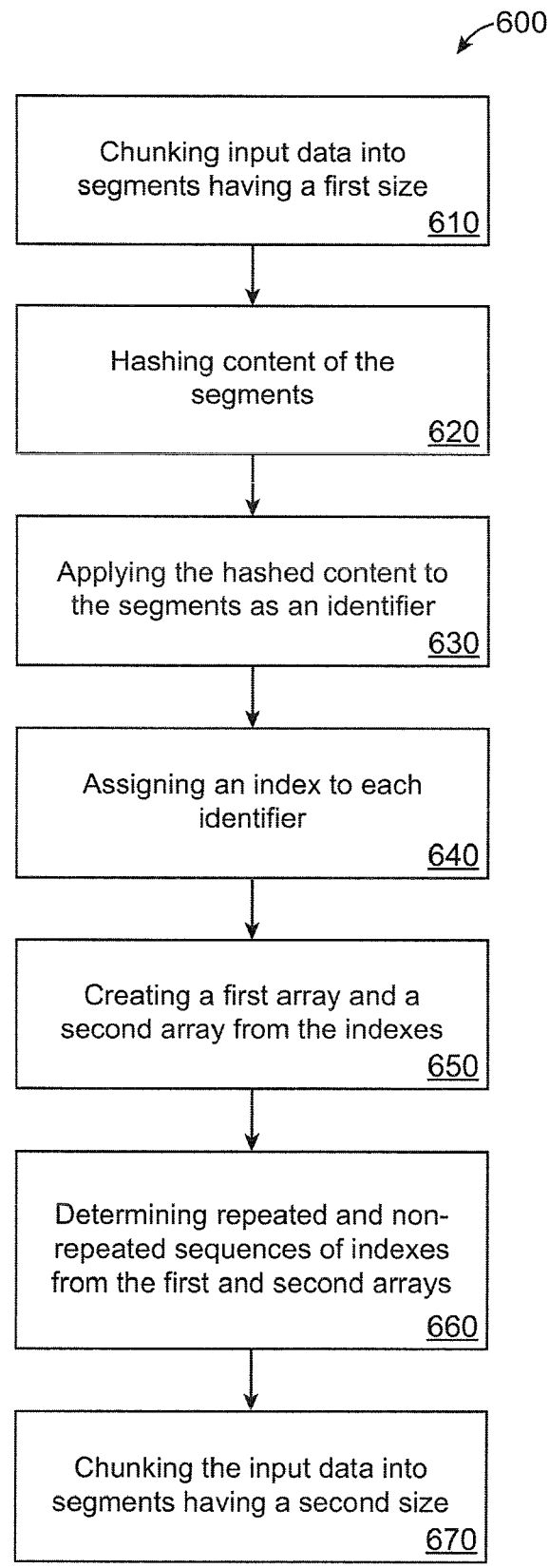
FIG. 6 illustrates a block diagram of a process of an embodiment of the invention.

FIG. 6 illustrates an embodiment of the invention including process 600 for optimizing chunk size in de-duplication. Process 600 begins with block 610 where input data is chunked into data segments each having a first size. In block 620 content of each of the data segments of the first size is hashed. In block 630, the content hash of each of the data segments of the first size is applied as an identifier to each of the data segments. It should be noted that when using the byte value instead of hashing content, the index is equal to the byte value itself. In this embodiment of the invention, blocks 620 and 630 are not necessary.

Next, in block 640 an index is assigned to each of the identifiers. In block 650, an SA and a LCP are created from the indexes. In block 660, repeated sequences of indexes and non-repeated indexes from the SA and the LCP are detected and a second chunking size based on the detected repeated sequences and non-repeated indexes are determined as follows. In one embodiment, the SA is iteratively processed. For any given item (or group of consecutive items x, y with same LCP), its LCP value is considered in comparison with the previous (p) and following (f) LCP. For example, the following patterns are noted:

p>x>f or p<x<f or repeated p>x,x,x>f or p<x,x,x<f→x belongs to the current branch and may or may not be a maximal.

p<x>f or p<x,x,x>f→x is a branch tip. Based on the left values of all items x, x may be a supermaximal or a tip with or without tip-maximals.

p>x<f or p>y,y,x<f→x belongs to a new (sub-)branch while y's belong to an original branch.

NRs have an LCP[NR]=0 & LCP[NR+1]=0.

For each item, the branch it belongs to is stored using a branch naming scheme according to an embodiment of the invention. The item type is stored as supermaximal, branch tip, branch tip maximal or non-repeat (maximals are determined later). For each branch, the set of unique tip left-values and the ID (SA, leaf value) of one tip (leaf) that is not left diverse or any leaf when a supermaximal tip node is stored. Each supermaximal is checked to detect if some of its occurrences overlap and reduce its size to the non-overlapping part. This will repeat (i.e., a "run") that repeats to cover the entire supermaximal.

Supermaximals may be added to a repository (e.g., repository 140). Any substrings that repeat are part of some supermaximal. That is, if the repeating substrings are left diverse they are a supermaximal, if they are not left diverse, some supermaximal will contain them. In one example, all positions are stored where the supermaximals occur for use in encoding. The positions of supermaximals and tip-maximals sorted by position are also stored to discover what supermaximal a given maximal belongs to for RC Resolution. The tip-maximals are stored because during the resolution, the arbitrary choice of the (not left diverse) tip leaf may lead to a tip-maximal, which requires further resolution. The repository may contain all supermaximals (LRCs) and can be completed with individual NRs if the application does not require NR grouping as described below.

In another example, the data in SA order is iteratively processed, using the data previously stored. Maximals are items that have not been marked as supermaximal, branch tip, branch tip maximal or non-repeat, and which have a left-value that has not been stored as a left value in their branch tip. Left values may be excluded from other maximals if covered by deeper maximals. Being on the same branch, the shorter maximals share common beginning with the deeper ones, and being non left-diverse, will be contained by some supermaximal on a different branch. This can be used to "clean-up" the overlapping supermaximals as these shorter maximals capture the overlapping parts of the supermaximals.

In another example, it is determined which supermaximal a maximal or branch tip maximal belongs to as follows: a tip item ID (leaf) is retrieved for the branch the maximal belongs to and its position (given by SA value) in the original string is determined. Next, the first supermaximal or branch tip maximal left of above-mentioned position is detected. If a supermaximal is detected, processing is completed. If a branch tip maximal is detected, processing is repeated. All positions that the maximals occur in are stored for encoding using the resolved supermaximal as the repository reference. In a faster implementation, all positions of supermaximals and maximals may be stored in a data structure and then all RCs are resolved in one linear pass over the data structure.

In one implementation, detecting repeated sequences of indexes includes analyzing the SA to assign the indexes into groups, and the second chunking size is further based on the size of the groups. The groups may include a largest sequence of repeated indexes group, a union of the largest sequence of repeated indexes and repeated indexes other than the largest sequence of repeated indexes group, and a non-repeated indexes group.

In block 670 the input data is chunked into data segments each having the second superchunked size. In one scenario, processing is iteratively performed over the data in original input order. It is determined whether an item is a NR using a rule LCP[NR]==0 & LCP[NR+1]==0 and keep track of blocks of NRs for encoding according to an embodiment of the invention. While the encoding is being performed "inline," other embodiments of the invention first perform the above-mentioned processing and then build the encoding in a final phase.

Superchunk overlap detection may be utilized wherein two or more leaves with the same diversity on a LRC branch indicate that the LRC overlaps with a different LRC or there is a run (i.e., overlaps with itself). In this case, the superchunks added to the repository do not share common substrings (are cleaned up) to get better compression. In another case, common SA and LCP (a generalized suffix tree) are created and the overlapping parts are eliminated.

Another example utilizes smart thresholding, such that wherein there is interest in finding superchunks larger than some threshold K (where K is the size of original chunks or bytes), the union of smaller than K superchunks are used instead. This takes care of potential overlap between these smaller than K superchunks. The resulting "union superchunks" may not show as such in the original string, but this is not a problem given the encoding format of <hash, offset, length>, which allows to specify the right part of the Superchunk to be used.

Figure 7:
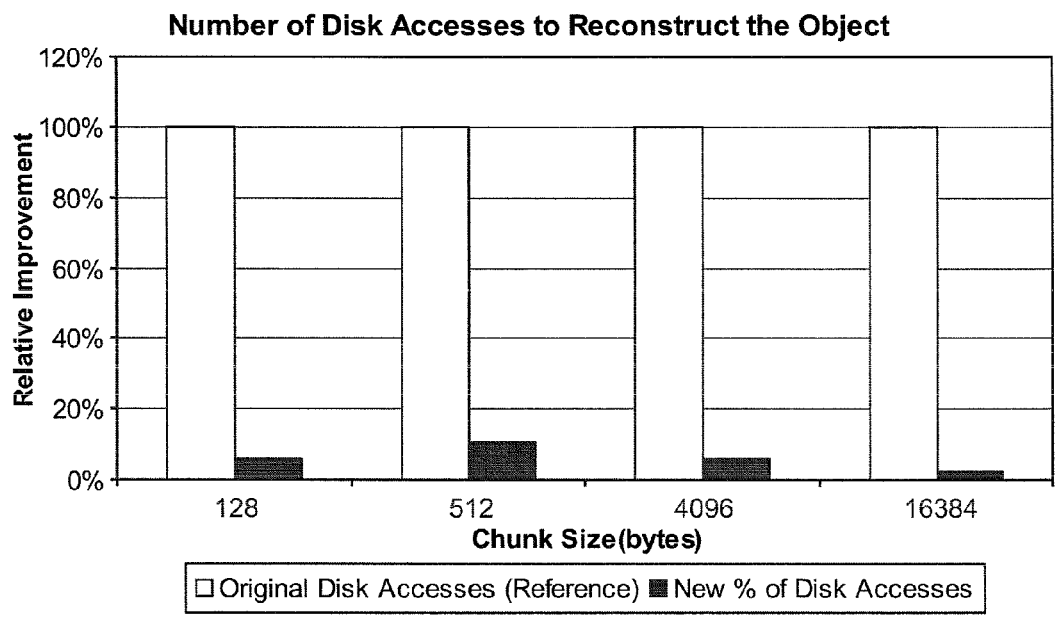
FIG. 7 illustrates an exemplary comparison graph of disk access to reconstruct a data object improvement versus object chunk segment size for fixed chunk segment size versus optimized chunk segment size according to an embodiment of the invention.

FIG. 7 illustrates an example comparison graph showing disk access (to reconstruct a data object) improvement versus object chunk segment size for fixed chunk segment sizes and optimized chunk segment size. For the example data illustrated in FIG. 7, a tar file was used having a size of 1 GB (gcc source code) as an example workload. The fragmentation improvement was determined offered by an embodiment of the invention by counting the number of disk accesses needed to reconstruct the object when using the original chunks (fix size chunking with sizes from 128 bytes/chunk to 16 KB/chunk), versus an embodiment of the invention where chunk size is optimized as Superchunks. As illustrated in FIG. 7, the embodiment used reduced fragmentation to less than 11% in the worst case and down to less than 3% in the best case.

Figure 8:
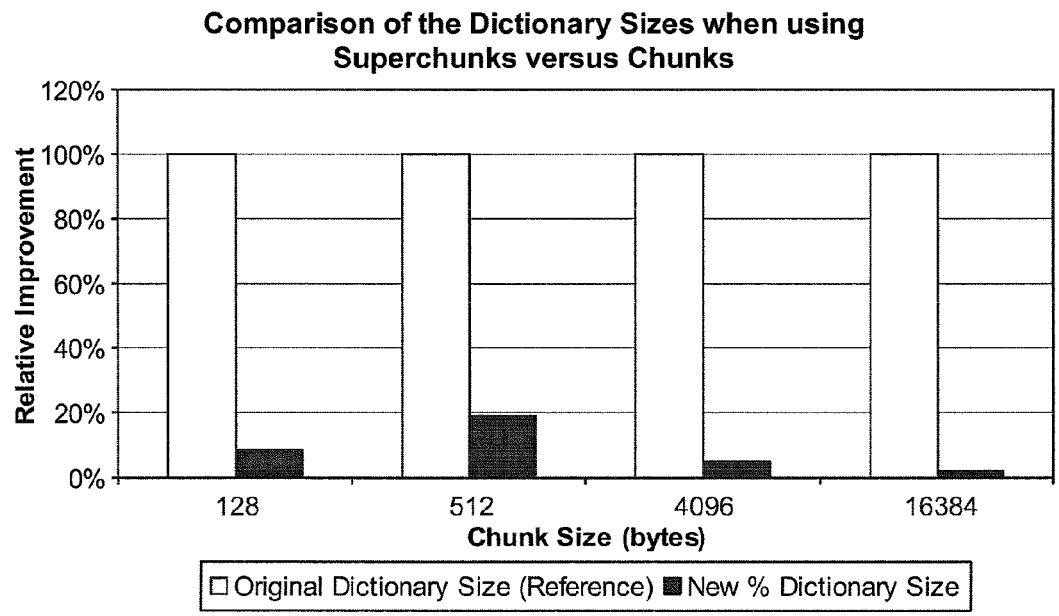
FIG. 8 illustrates an exemplary comparison graph of repository sizes versus object chunk segment size for fixed chunk segment size versus optimized chunk segment size according to an embodiment of the invention.

FIG. 8 illustrates an exemplary comparison graph of repository sizes versus object chunk segment size for fixed chunk segment size versus optimized chunk segment size according to an embodiment of the invention. Related to fragmentation reduction is the reduction in the number of entries in the repository when using the super-chunks (vs. original chunks). As illustrated, one embodiment of the invention achieves a reduction between less than 20% to less than 2% depending on the chunk size.

Figure 9:
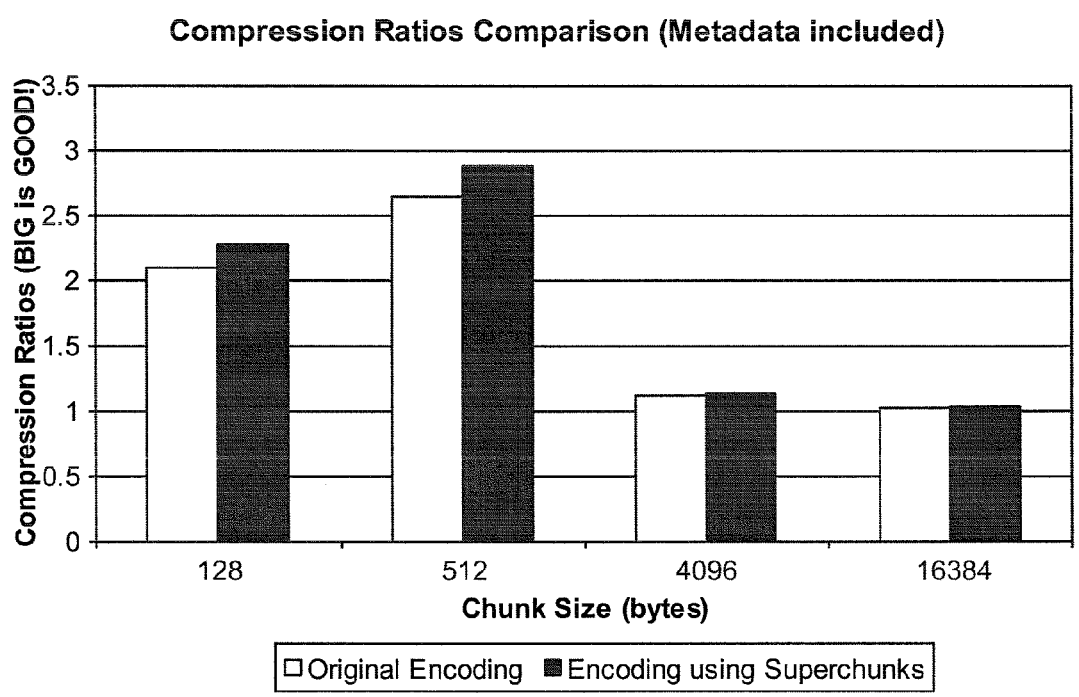
FIG. 9 illustrates an exemplary comparison graph of compression ratios versus object chunk segment size for fixed chunk segment size versus optimized chunk segment size according to an embodiment of the invention.

FIG. 9 illustrates an exemplary comparison graph of compression ratios versus object chunk segment size for fixed chunk segment size versus optimized chunk segment size according to an embodiment of the invention. In this embodiment, fragmentation is reduced while achieving a similar compression (de-duplication) ratio as when using the original chunk size. As illustrated, the embodiment improves the compression ratio achieved (the real compression ratio that includes metadata). The embodiment used for the data illustrated in FIGS. 7-9 of detecting the Superchunks given the original sequence of chunks or just the bytes, is very fast; for the 1 GB tar file running a Perl program, which takes a few seconds on a customary Intel PC.

The described embodiments of the invention provide an optimization for the management and storage of unique object data chunks in a de-duplication system. In a sequence of data object chunks, an object is decomposed into, subsequences of adjacent chunks that tend to repeat. For smaller data object chunk sizes, the length of repeating sub-sequences tends to increase. The embodiments of the invention partition the object into segments (i.e. chunks), such that the partitioning: (1) adds the fewest "large" chunks to the repository, where a large chunk equals an aggregate of previous "small" chunks (or bytes) appearing in sequence, and (2) achieves a similar de-duplication ratio as when using the small chunks, (3) significantly reduces "fragmentation," and also is (4) a fast chunking method (quasi linear time and space in the object size).

The embodiments of the invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer, processing device, or any instruction execution system. For the purposes of this description, a computer-usable or computer readable medium can be any apparatus that can contain, store, communicate, or transport the program for use by or in connection with the instruction execution system, apparatus, or device.

The medium can be electronic, magnetic, optical, or a semiconductor system (or apparatus or device). Examples of a computer-readable medium include, but are not limited to, a semiconductor or solid state memory, magnetic tape, a removable computer diskette, a RAM, a read-only memory (ROM), a rigid magnetic disk, an optical disk, etc. Current examples of optical disks include compact disk-read only memory (CD-ROM), compact disk-read/write (CD-R/W) and DVD.

I/O devices (including but not limited to keyboards, displays, pointing devices, etc.) can be connected to the system either directly or through intervening controllers. Network adapters may also be connected to the system to enable the data processing system to become connected to other data processing systems or remote printers or storage devices through intervening private or public networks. Modems, cable modem and Ethernet cards are just a few of the currently available types of network adapters.

In the description above, numerous specific details are set forth. However, it is understood that embodiments of the invention may be practiced without these specific details. For example, well-known equivalent components and elements may be substituted in place of those described herein, and similarly, well-known equivalent techniques may be substituted in place of the particular techniques disclosed. In other instances, well-known structures and techniques have not been shown in detail to avoid obscuring the understanding of this description.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

While certain exemplary embodiments have been described and shown in the accompanying drawings, it is to be understood that such embodiments are merely illustrative of and not restrictive on the broad invention and that this invention not be limited to the specific constructions and arrangements shown and described, since various other modifications may occur to those ordinarily skilled in the art.

What is claimed is:

1. A method of determining sizing of chunk portions in data de-duplication, comprising:
employing a hardware processor for:
chunking input data into a first plurality of data segments each having a first size;
assigning an identifier to each of the first plurality of data segments;
assigning an index to each of said identifiers;
creating a suffix array structure and a longest common prefix array structure from the indexes;
based on the suffix array structure and the longest common prefix array structure, encoding each segment using an index, wherein indexes are generated for a largest sequence of repeated indexes (LRC) and non-repeated (NR) indexes;
detecting repeated sequences of indexes and non-repeated indexes from the suffix array structure and the longest common prefix array structure;
determining a second size based on said detected repeated sequences and non-repeated indexes, wherein said determining comprises detecting occurrences of repeated indexes in each LRC for overlap, and reducing each LRC having overlapped occurrences of repeated indexes to a non-overlapped index portion for reducing LRC size, wherein repeated indexes are left-diverse if associated left Identifications (IDs) are different, repeated indexes that are left-diverse comprise an LRC, and repeated indexes that are not left-diverse belong to an LRC; and
chunking the input data into a second plurality of data segments each having the second size,
wherein said detecting repeated sequences of indexes comprises:
analyzing the suffix array structure to assign the indexes into groups, wherein the second size is further based on the size of the groups, and the indexes comprise a sequence of distinct integers.

2. The method of claim 1, wherein assigning the identifier further comprises:
hashing content of each of the first plurality of data segments; and
applying the content hash of each of the first plurality of data segments as an identifier to each of the first plurality of data segments, wherein the detecting further comprises detecting repeated sequences of indexes that cannot be extended while still being repeated.

3. The method of claim 1, wherein the groups comprise: a largest sequence of repeated indexes group, a union of the largest sequence of repeated indexes and repeated indexes other than the largest sequence of repeated indexes group, and a non-repeated indexes group, and the repeated sequences cannot be extended at a left or right end of a sequence of identifiers.

4. The method of claim 1, wherein detecting-repeated indexes comprises comparing adjacent non-repeating longest common prefixes, and data segments with an equal hash are assigned a same index.

5. The method of claim 1, wherein the identifier comprises a format of: hash of the content of a data segment, a position of the data segment in a sequence of data segments, and a length of the data sequence.

6. The method of claim 1, wherein said detecting further comprises analyzing the suffix array structure and the longest common prefix array structure as a virtual suffix tree, and using the virtual suffix tree for detecting and locating a longest repeated sub-sequence within a sequence of identifiers.

7. An apparatus for determining segment size in de-duplication, comprising:
a hardware processor coupled with:

a chunking module configured to segment input data into a first plurality of data segments each having a first size;

an indexing module configured to assign an index to each of the first plurality of data segments, an identifier module configured to assign an identifier to each of the first plurality of data segments, where the indexing module is further configured to assign an index to each of said identifiers, and create a suffix array structure and a longest common prefix array structure from the indexes; and an array processor module configured to detect repeated sequences of indexes and non-repeated indexes from the suffix array structure and longest common prefix array structure, and to determine a second size based on the detected repeated sequences of indexes and non-repeated indexes, and based on the suffix array structure and the longest common prefix array structure, encode each segment using an index, wherein indexes are generated for a largest sequence of repeated indexes (LRC) and non-repeated (NR) indexes, wherein said determine the second size comprises detecting occurrences of repeated indexes in each LRC for overlap, and reducing each LRC having overlapped occurrences of repeated indexes to a non-overlapped index portion for reducing LRC size, wherein repeated indexes are left-diverse if associated left Identifications (IDs) are different, repeated indexes that are left-diverse comprise an LRC, and repeated indexes that are not left-diverse belong to an LRC, wherein detecting occurrences of repeated indexes further comprises:

analyzing the suffix array structure to assign the indexes into groups, wherein the second size is further based on the size of the groups, and the indexes comprise a sequence of distinct integers, wherein the chunking module further segments the input data into a second plurality of data segments each having the second size.

8. The apparatus of claim 7, wherein said array processor module further analyzes the suffix array structure and assigns the indexes into groups.

9. The apparatus of claim 8, wherein the second size is further based on the size of the groups, and wherein a format that each segment is encoded with comprises a hash, an offset and a length of the segment.

10. The apparatus of claim 7, wherein the indexing module is further configured to hash content of each of the first plurality of data segments; and the identifier module is further configured for applying the content hash of each of the first plurality of data segments as the identifier to each of the first plurality of data segments.

11. A computer program product comprising a non-transitory computer usable medium including a computer readable program, wherein the computer readable program when executed on a computer causes the computer to:

chunk input data into a first plurality of data segments each having a first size;

assign an identifier to each of the first plurality of data segments;

assign an index to each of said identifiers;

create a first array structure and a second array structure from the indexes;

detect repeated sequences of indexes that cannot be extended while still being repeated and non-repeated indexes from the first array structure and the second array structure; determine a second size based on said detected repeated sequences of indexes and non-repeated indexes, wherein said determine the second size comprises detecting occurrences of repeated indexes in each repeated sequences of indexes that cannot be extended while still being repeated for overlap, and reducing each repeated sequences of indexes that cannot be extended while still being repeated having overlapped occurrences of repeated indexes to a non-overlapped index portion for reducing size, wherein repeated indexes are left-diverse if associated left Identifications (IDs) are different, repeated indexes that are left-diverse comprise an LRC, and repeated indexes that are not left-diverse belong to an LRC, wherein said detect repeated sequences of indexes further causes the computer to:

analyze the first structure to assign the indexes into groups, and the indexes comprise a sequence of distinct integers; and chunk the input data into a second plurality of data segments each having the second size.

12. The computer program product of claim 11, wherein the assign the identifier comprises instructions that further cause the machine to hash content of each of the first plurality of data segments; and apply the content hash of each of the first plurality of data segments as the identifier to each of the first plurality of data segments.

13. The computer program product of claim 11, wherein the groups comprise a largest sequence of repeated indexes group, a union of the largest sequence of repeated indexes and repeated indexes other than the largest sequence of repeated indexes group, and a non-repeated indexes group, and the repeated sequences cannot be extended at a left or right end of a sequence of identifiers.

14. The computer program product of claim 11, wherein said detecting non-repeated indexes comprises comparing adjacent non-repeating longest common prefixes.

15. The computer program product of claim 11, wherein the second size is larger than the first size.

16. The computer program product of claim 11, wherein format of the identifier only includes a hash of the content of a data segment, a position of the data segment in a sequence of data segments, and a length of the data sequence.

17. The computer program product of claim 11, wherein the first array structure comprises a suffix array structure, and the second array structure comprises a longest common prefix array structure, wherein said detect further comprises analyzing the suffix array structure and the longest common prefix array structure as a virtual suffix tree, and detecting and locating a longest repeated sub-sequence within a sequence of identifiers.

* * * * *